United States Patent [19]

Sandhu

[11] Patent Number: 5,192,589
[45] Date of Patent: Mar. 9, 1993

[54] LOW-PRESSURE CHEMICAL VAPOR DEPOSITION PROCESS FOR DEPOSITING THIN TITANIUM NITRIDE FILMS HAVING LOW AND STABLE RESISTIVITY

[75] Inventor: Gurtej S. Sandhu, Boise, Id.

[73] Assignee: Micron Technology, Inc., Boise, Id.

[21] Appl. No.: 755,202

[22] Filed: Sep. 5, 1991

[51] Int. Cl.$^5$ .................. C23C 16/18; C23C 16/34
[52] U.S. Cl. .................. 427/255.1; 427/99; 427/248.1
[58] Field of Search .......... 427/255.1, 248.1, 255.6, 427/249, 96, 99

[56] References Cited

U.S. PATENT DOCUMENTS

| | | | |
|---|---|---|---|
| 4,746,501 | 5/1988 | Maya | 423/413 |
| 4,758,539 | 7/1988 | Brown et al. | 501/96 |
| 5,087,593 | 2/1992 | Narula | 501/96 |
| 5,089,438 | 2/1992 | Katz | 437/184 |
| 5,090,985 | 2/1992 | Soubeyrand et al. | 65/60.52 |

OTHER PUBLICATIONS

K. Sugiyama et al., J. Electrochem. Soc., 122 (1975) pp. 1545-1549, "Low Temperature of Metal Nitrides by Thermal Decomposition . . . ".
G. Brown et al., J. Am. Ceram. Soc., 71 [1] (1988) pp. 78-82, "Ammonolysis Products of the Dialkylamides of Titanium . . . ".
Roy G. Gordon and Steven R. Kurtz, 1986, Material Research Society Symposium Proc. "Thin Solid Films", vol. 140 pp. 277-290.
D. C. Bradley and T. M. Thomas, J. Chem. Soc. 1960, 3857.
D. Seyferth and G. Mignani, 1988, J. Mater. Sci. Lett. 7, p. 487.
Renaud M. Fix, Roy G. Gordon, and David M. Hoffman, Mat. Res. Soc. Symp. Proc. vol. 168.

*Primary Examiner*—Shrive Beck
*Assistant Examiner*—Bret Chen
*Attorney, Agent, or Firm*—Angus C. Fox, III

[57] ABSTRACT

An improved process for creating thin titanium nitride films via chemical vapor deposition. The films deposited using the improved process are characterized by low and stable bulk resistivity. The deposition process is performed in a low-pressure chamber (i.e., a chamber in which pressure has been reduced to between 0.1 and 2 Torr), and utilizes ammonia and the metal-organic compound tetrakis(dimethylamido)titanium, $Ti(NMe_2)_4$, as precursors. Ammonia flow rate in the deposition chamber is maintained at more than approximately thirty times the metal-organic precursor flow rate. Such flow rates result in deposited TiN films having low and relatively constant bulk resistivity over time when exposed to an aerobic environment. Oxygen content of films produced using the improved process is less than 5 percent. Additionally, the deposition process is performed at a substrate temperature of at least 200° C., and ideally as high at 450° C. in order to minimize bulk resistivity of the deposited TiN films.

15 Claims, 3 Drawing Sheets

LOW-PRESSURE CHEMICAL VAPOR DEPOSITION PROCESS FOR DEPOSITING THIN TITANIUM NITRIDE FILMS HAVING LOW AND STABLE RESISTIVITY

FIELD OF THE INVENTION

This invention relates to integrated circuit manufacturing technology and, more specifically, to processes for depositing titanium nitride through chemical vapor deposition.

BACKGROUND OF THE INVENTION

The compound titanium nitride (TiN) has numerous potential applications because it is extremely hard, chemically inert (although it readily dissolves in hydrofluoric acid), an excellent conductor, possesses optical characteristics similar to those of gold, and has a melting point around 3000° C. This durable material has long been used to gild inexpensive jewelry and other art objects. However, during the last ten to twelve years, important uses have been found for TiN in the field of integrated circuit manufacturing. Not only is TiN unaffected by integrated circuit processing temperatures and most reagents, it also functions as an excellent barrier against diffusion of dopants between semiconductor layers. In addition, TiN also makes excellent ohmic contact with other conductive layers.

Until little more than a year ago, reactive sputtering, the nitrogen anneal of an already deposited titanium layer, and high-temperature atmospheric pressure chemical vapor deposition (APCVD), were the three principal techniques available for creating thin titanium nitride films. Reactive sputtering and nitrogen anneal of deposited titanium result in films having poor step coverage, which are not useable in submicron processes. Chemical vapor deposition process have an important advantage in that a conformal layers of any thickness may This is especially advantageous in ultra-large-scale integration circuits, where minimum feature widths may be smaller than $0.5\mu$. Layers as thin as 10Å may be readily produced using CVD. However, TiN coatings prepared used the high-temperature APCVD process must be prepared at temperatures between 900°-1000° C. using titanium tetrachloride, nitrogen and hydrogen as reactants. The high temperatures involved in this process are incompatible with conventional integrated circuit manufacturing processes. Hence, depositions using the APCVD process are restricted to refractory substrates such as tungsten carbide.

The prospects for the use of TiN films in integrated circuits improved in 1986, when Roy G. Gordon and Steven R. Kurtz, colleagues in the Department of Chemistry at Harvard University, announced at the Material Research Society Symposium that TiN could be deposited in a new APCVD process at lower temperatures (1986 Mat. Res. Soc. Symp. Proc. Vol. 140, p. 277). Using this process, titanium chloride is reacted with ammonia within a temperature range of 500°-700° C. However, even this temperature is incompatible with silicon chips metallized with aluminum, amorphous silicon solar cells and plastics. In addition, the presence of hydrogen chloride gas, a corrosive by-product of the reaction, is undesirable.

Some thirty years ago, D. C. Bradley and I. M. Thomas showed that, in solution, $Ti(NR_2)_4$ complexes undergo transamination reactions under very mild conditions (J. Chem. Soc. 1960; 3857). Then in 1988, D. Seyferth, and G. Mignani reported that polymeric titanium imides could be transaminated with $NH_3$ and pyrolized to form titanium nitride in the form of a porous solid ceramic (J. Mater. Sci. Lett. 7, p. 487, 1988). Based on these earlier studies, Renaud M. Fix, Roy G. Gordon, and David M. Hoffman, colleagues at the Department of Chemistry of Harvard University, hypothesized that TiN might be synthesizeable with an APCVD process similar to that devised by Gordon and Kurtz, but using ammonia and $Ti(NR_2)_4$ compounds as precursors. The results of their confirming experiments were presented in a paper delivered at the Material Research Society Symposium (Mat. Res. Soc. Symp. Proc. Vol. 168). Smooth (i.e., mirror-like), nonporous, gold-colored TiN films were produced at temperatures between 100° and 400° C., using ammonia and the metal-organic compound tetrakis(dimethylamido)titanium, $Ti(NMe_2)_4$, as precursors. Flow rate ratios of less than 10:1 of ammonia to $Ti(NMe_2)_4$ were utilized.

A problem with TiN films produced with chemical vapor deposition using $Ti(NMe_2)_4$ and $NH_3$ as precursors at the aforementioned flow rates is that, in spite of the apparent high quality and golden hue of the deposited TiN films, the resistivity of the films is highly unstable, increasing rather dramatically as a function of the time the film is exposed to the atmosphere. Since TiN films are often used for conductive barrier layers in integrated circuit structures, a TiN film having high resistivity is unsuitable for such uses. Resistive instability of TiN films is demonstrated by depositing a TiN film on a wafer heated to 300° C. in a low-pressure chemical vapor deposition (LPCVD) chamber. Approximately 5 sccm of $Ti(NMe_2)_4$ was introduced into the chamber from a bubbler heated to 50° C. into which a helium carrier gas was introduced at 30 sccm. When ammonia flow was 30 sccm, sheet resistivity of the deposited TiN film was in excess of 1 megohms/square. When ammonia flow was increased to 50 sccm, sheet resistivity of the deposited TiN film was initially approximately 300 kilo-ohms/square. Within two hours, this value had increased by 30 percent, and after 48 hours, the sheet resistivity was in excess of 1 megaohms/square. It is postulated that the cause of this instability is the existence of unsaturated titanium bonds in the deposited TiN films. When the newly-created TiN films are exposed to the atmosphere, oxygen most likely diffuses into the films and forms titanium dioxide. Since titanium dioxide ($TiO_2$) is an exceptionally good dielectric, even a small amount of it will dramatically increase the resistance of a TiN film. SIMS analysis of the deposited TiN films indicates that oxygen content increases from less than 5 percent upon removal from the deposition chamber to as much as 20 percent 48 hours later.

What is needed is a chemical vapor deposition process for TiN which will result in highly conformal films of stable, low resistivity.

SUMMARY OF THE INVENTION

This invention constitutes an improved process for creating thin titanium nitride films via chemical vapor deposition. The deposited films are highly stable with regard to resistivity. The deposition process takes place in a low-pressure chamber (i.e, a chamber in which pressure has been reduced to between 0.1 and 2 Torr), and utilizes ammonia and the metal-organic compound tetrakis(dimethylamido)titanium, $Ti(NMe_2)_4$, as precursors. It has been determined that initial bulk resistivity in TiN deposited using CVD is affected by both the ratio of precursors (i.e., ammonia and Ti(NMe$_2$)$_4$, in the deposition chamber, and the temperature at which deposition occurs. Resistive stability of such TiN films is affected primarily by the ratio of precursors.

It has been determined that when ammonia flow rate in the deposition chamber is maintained at more than approximately 30 times the metal-organic precursor flow rate, the oxygen content of deposited TiN films drops to below 5 percent and remains relatively constant over time in an aerobic environment. It has also been determined that resistivity of deposited TiN films decreases with deposition temperature, with the minimal acceptable temperature for depositions compatible with typical semiconductor manufacturing processes being at least 200° C, and with the optimum temperature for least resistivity being approximately 450° C. Reactions occurring at the higher temperature are generally still compatible with most integrated circuit substrates.

PREFERRED EMBODIMENT OF THE INVENTION

The improved process for creating thin titanium nitride films via chemical vapor deposition will now be described in detail. The improved process results in films having substantially constant low resistivity. Like the prior art process developed by Harvard University by Renaud M. Fix, et al, the improved process utilizes the metal-organic compound tetrakis(dimethylamido)-titanium, Ti(NMe$_2$)$_4$, and ammonia as precursors Low-temperature chemical vapor deposition of TiN has heretofore been performed in atmospheric pressure chambers. However, such chambers must be flushed with an inert gas such as helium for extended periods (usually several hours) in order to purge the system of oxygen. The presence of oxygen in the deposition chamber would result in the formation of titanium dioxide, as well as titanium nitride. Such extended purge periods are incompatible with production processes, since throughput is greatly hampered. In order to eliminate the requirement for extended purge periods, the improved deposition process is performed in a low-pressure chamber.

Following introduction of the substrate on which the deposition is to be made into the deposition chamber, a vacuum is applied to the chamber in order to reduce internal pressure to between 0.1 and 2 Torr. Ti(NMe$_2$)$_4$ is converted to a gaseous state in a bubbler heated to approximately 50° C. Helium carrier gas, at a flow rate of approximately 50 sccm, is introduced into the bubbler, after which it is piped in to the deposition chamber, carrying the gaseous Ti(NMe$_2$)$_4$, which is equivalent to approximately 5 sccm. Ammonia gas is also introduced into the low pressure deposition chamber.

Figure 1:
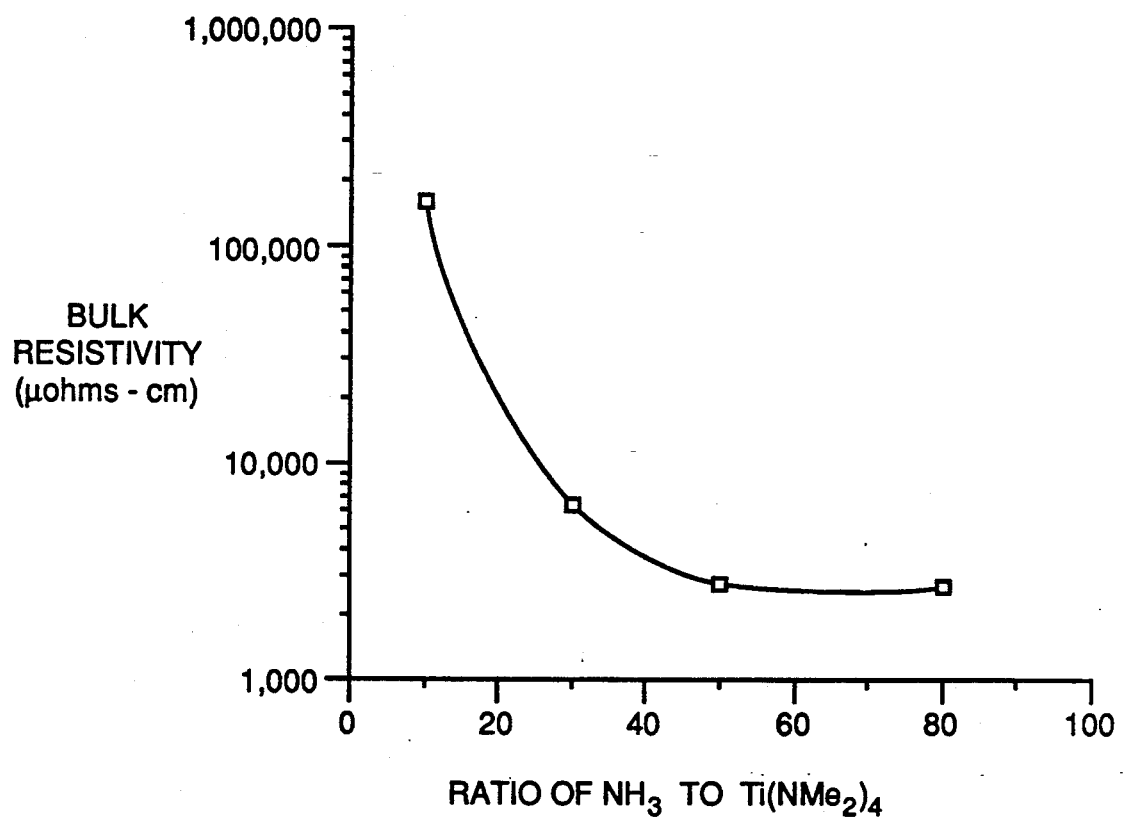
FIG. 1 is a graph of initial bulk resistivity of TiN films as a function of the ratio of ammonia to Ti(NMe$_2$)$_4$ in the deposition chamber.

Initial resistivity (not to be confused with resistive stability, which will be discussed later) in TiN films has been shown to be significantly affected by two variables, one of which is the ratio of ammonia to Ti(NMe$_2$)$_4$ in the deposition chamber. FIG. 1 depicts the initial bulk resistivity of deposited TiN films (i.e., immediately following deposition) as a function of the ammonia flow rate. With the flow of Ti(NMe$_2$)$_4$ being maintained at a constant value of approximately 5 sccm, the ammonia flow rate was varied between 50 sccm and 400 sccm. It will be noted that at an ammonia flow rate of 50 sccm, initial bulk resistivity was nearly 200,000 $\mu$ohm-cm. An ammonia flow rate of 150 sccm, the resistivity value had dropped to approximately 7000 $\mu$ohm-cm. At a flow rate of 250 sccm, the resistivity had dropped to approximately 1700 $\mu$ohm-cm. Very little drop in resistivity was noted as the ammonia flow was increased beyond 250 sccm. It is hypothesized that at an ammonia flow rate of 250 sccm, TiN having a stoichiometry of close to 1:1 is deposited. Increasing the ammonia flow beyond the 250 sccm rate therefore will not result in a significant change from this stoichiometric relationship.

Figure 2:
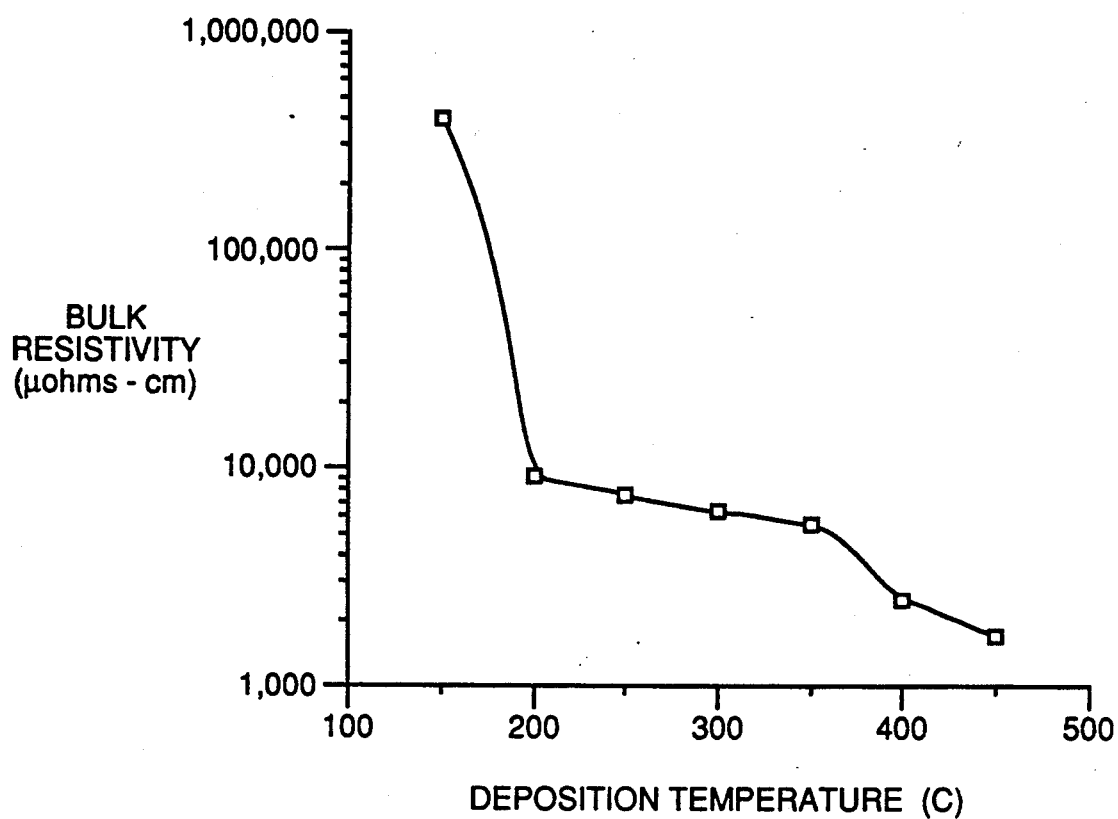
FIG. 2 is a graph of initial bulk resistivity of TiN films as a function of deposition temperature.

Initial resistivity is also a function of deposition temperature. FIG. 2 depicts initial bulk resistivity as a function of deposition temperature. It will be noted that resistivity of deposited TiN films drops dramatically between 150° and 200° C. Resistivity continues to drop at a fairly constant rate until 350° C., at which temperature, the drop in resistivity accelerates up to 400° C. The rate of drop then slows between 400° and 450° C. Temperatures around 450° C. are considered optimum for conventional integrated circuit manufacturing processes, as aluminum melts at 650° C.

Figure 3:
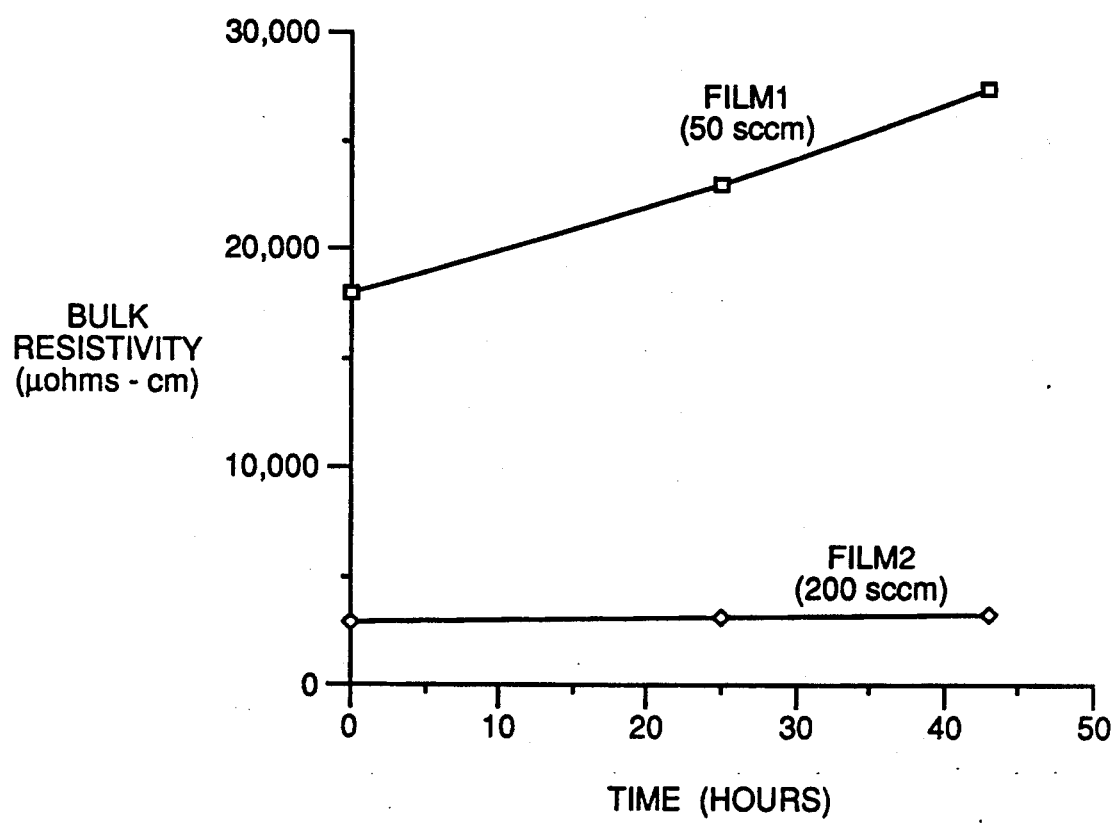
FIG. 3 is a graph of bulk resistivity of two TiN films as a function of time of exposure to the atmosphere.

FIG. 3 shows the effect of varying rates of ammonia flow on the resistive stability deposited TiN films. When ammonia flow was 50 sccm, bulk resistivity is highly unstable over time, increasing from a low of approximately 18,000 $\mu$ohms-cm immediately following deposition to approximately 27,000 $\mu$ohms-cm 43 hours later. On the other hand, when ammonia flow was 200 sccm, initial bulk resistivity (i.e., immediately following deposition) was 2,600 $\mu$ohms-cm and increased by only about 10 percent over the same 43 hour period. It was hypothesized that the cause of this instability was the existence of unsaturated titanium bonds in the deposited TiN films. Thus, when the newly-created TiN films are exposed to the atmosphere, oxygen most likely diffuses into the films and forms titanium dioxide. Since titanium dioxide (TiO$_2$) is an exceptionally good dielectric, even a small amount of it will dramatically increase the resistance of a TiN film. This hypothesis was substantiated by SIMS analysis of the deposited TiN films, which indicated that oxygen content increases from less than 5 percent upon removal from the deposition chamber to as much as 20 percent 48 hours later. SIMS analysis also indicated that when ammonia flow is maintained at more than approximately thirty times the metal-organic precursor flow rate, the oxygen content of deposited TiN films drops to below 5 percent and remains relatively constant over time in an aerobic environment.

Deposition temperature apparently does not markedly affect resistive stability of deposited TiN films, at least between 150° and 450°. Most likely, the films deposited at the lower temperatures are either porous or have stable, but resistive impurities such as carbon imbedded in them.

Although only a single embodiment of the inventive process has been disclosed herein, it will be obvious to those having ordinary skill in the art that modifications and changes may be made thereto without affecting the scope and spirit of the invention as claimed.

I claim:

1. An improved process for creating a titanium nitride film having stable bulk resistivity on a substrate via chemical vapor deposition, said process comprising the following sequence of steps:
   a) introducing the substrate in a chemical vapor deposition chamber;
   b) purging the chamber of oxygen;
   c) establishing a flow of gaseous ammonia and gaseous titanium metal organic compound into the chamber such that the flow rate of the former is more than approximately thirty times the flow rate of the latter: and
   d) heating the substrate to at least 200° C.

2. The improved process of claim 1, wherein the titanium metal- organic compound is tetrakis(dimethylamido)titanium 3. The improved process of claim 1, wherein the titanium metal-organic precursor is dissolved in an inert carrier gas.

4. The improved process of claim 3, wherein the inert carrier gas is helium.

5. The improved process of claim 4, wherein the chamber is purged of oxygen by evacuating the chamber to a pressure of less than 2 torr.

6. The improved process of claim 5, wherein the chamber is evacuated to a pressure of approximately 0.1 torr.

7. The improved process of claim 6, wherein the substrate is heated to 400°-450° C.

8. The improved process of claim 4, wherein the tetrakis(dimethylamido)titanium is converted to a gaseous state in a bubbler that is heated to a temperature within the range of 40°-60° C.

9. An improved process for creating a titanium nitride film having stable bulk resistivity on a substrate via chemical vapor deposition, said process being accomplished in a deposition chamber from which all oxygen has been substantially purged, and into which the precursor compounds of gaseous ammonia and a gaseous titanium metal-organic compound are introduced, said titanium metal-organic compound reacting with the ammonia to form titanium nitride, which deposits on the substrate, wherein the improvement consists of establishing a flow of gaseous ammonia that is more than approximately thirty times the flow rate of the titanium metal organic compound and heating the substrate to at least 200° C.

10. The improved process of claim 9, wherein the titanium metal-organic compound is tetrakis(dimethylamido)titanium.

11. The improved process of claim 10, wherein the titanium metal-organic precursor is dissolved in an inert carrier gas.

12. The improved process of claim 11, wherein the inert carrier gas is helium.

13. The improved process of claim 12, wherein the chamber is purged of oxygen by evacuating the chamber to a pressure of less than 2 torr.

14. The improved process of claim 13, wherein the chamber is evacuated to a pressure of approximately 0.1 torr.

15. The improved process of claim 14, wherein the substrate is heated to 400°-450° C.

* * * * *